US012601056B2

(12) United States Patent
Lethien et al.

(10) Patent No.: US 12,601,056 B2
(45) Date of Patent: Apr. 14, 2026

(54) METHOD FOR MANUFACTURING A THIN-FILM LITHIATED MATERIAL

(71) Applicants: Centre National de la Recherche Scientifique, Paris (FR); Universite de Lille, Lille (FR); Centrale Lille Institut, Villeneuve d'Ascq (FR); Universite Polytechnique Hauts de France, Aulnoy-Lez-Valenciennes (FR); Universite d'Artois, Arras (FR); Nantes Universite, Nantes (FR)

(72) Inventors: Christophe Lethien, Violaines (FR); Maxime Hallot, Denain (FR); Pascal Roussel, Lille (FR); Thierry Brousse, La Chapelle-sur-Erdre (FR)

(73) Assignees: Centre National de la Recherche Scientifique, Paris (FR); Universite de Lille, Lille (FR); Centrale Lille Institut, Villeneuve d'Ascq (FR); Universite Polytechnique Hauts de France, Aulnoy-lez-Valenciennes (FR); Universite d'Artois, Arras (FR); Nantes Universite, Nantes (FR)

( * ) Notice: Subject to any disclaimer, the term of this patent is extended or adjusted under 35 U.S.C. 154(b) by 0 days.

(21) Appl. No.: 18/247,432

(22) PCT Filed: Sep. 30, 2021

(86) PCT No.: PCT/FR2021/051697
§ 371 (c)(1),
(2) Date: Mar. 30, 2023

(87) PCT Pub. No.: WO2022/069842
PCT Pub. Date: Apr. 7, 2022

(65) Prior Publication Data
US 2024/0011155 A1 Jan. 11, 2024

(30) Foreign Application Priority Data
Oct. 1, 2020 (FR) ...................................... 2010047

(51) Int. Cl.
$H01M$ 4/04 (2006.01)
$C23C$ 8/12 (2006.01)
(Continued)

(52) U.S. Cl.
CPC .......... *C23C 16/45553* (2013.01); *C23C 8/12* (2013.01); *C23C 16/18* (2013.01); *C23C 16/45555* (2013.01)

(58) Field of Classification Search
CPC .............. C23C 16/45553; C23C 16/18; C23C 16/45555; C23C 8/12
See application file for complete search history.

(56) References Cited

U.S. PATENT DOCUMENTS

2011/0076556 A1* 3/2011 Karthikeyan ......... H01M 4/485
429/188
2011/0099798 A1 5/2011 Nilsen et al.
(Continued)

FOREIGN PATENT DOCUMENTS

DE 102017203910 A1 9/2018
WO WO-2009084966 A1 * 7/2009 ............. C23C 16/40
(Continued)

OTHER PUBLICATIONS

WO 2021087416 (Year: 2021).*
(Continued)

*Primary Examiner* — Austin Murata
(74) *Attorney, Agent, or Firm* — Conley Rose, P.C.

(57) ABSTRACT
The invention relates to a manufacturing method for manufacturing a positive electrode layer based on a lithiated material suitable for three-dimensional batteries, or 3D
(Continued)

batteries, so as to obtain a lithiated material on a substrate, the lithiated material comprising several thin layers, i.e. layers that have thicknesses between 1 nm and 1 μm, are made up of electrochemically active complex materials, and are, inter alia, homogeneous and suitable for conforming to the raised patterns of greater or lesser complexity of the surface of the substrate on which the lithiated material is deposited.

10 Claims, 2 Drawing Sheets

(51) Int. Cl.
  *C23C 16/18* (2006.01)
  *C23C 16/455* (2006.01)

(56) References Cited

U.S. PATENT DOCUMENTS

| | | | | |
|---|---|---|---|---|
| 2012/0077082 A1* | 3/2012 | Se-Hee | | H01M 4/485 |
| | | | | 427/78 |
| 2014/0302392 A1* | 10/2014 | Li | | H01M 4/525 |
| | | | | 429/223 |
| 2021/0126283 A1* | 4/2021 | Lim | | H01M 4/667 |
| 2022/0140307 A1* | 5/2022 | Darolles | | H01G 11/70 |
| | | | | 429/209 |

FOREIGN PATENT DOCUMENTS

| | | |
|---|---|---|
| WO | 2011002920 A2 | 1/2011 |
| WO | 2015052412 A1 | 4/2015 |
| WO | 2016011412 A1 | 1/2016 |
| WO | 2018095845 A1 | 5/2018 |
| WO | 2022069842 A1 | 4/2022 |

OTHER PUBLICATIONS

WO 2009084966 (Year: 2009).*
Kazyak et al. "Atomic Layer Deposition of the Solid Electrolyte Garnet Li7La3Zr2O12" (Apr. 2017).*
Foreign Communication from a Related Counterpart Application, International Search Report and Written Opinion dated Dec. 9, 2021, International Application No. PCT/FR2021/051697 filed on Sep. 30, 2021.
Foreign Communication from a Related Counterpart Application, Chinese Office Action dated Aug. 8, 2025, Chinese Application No. 202180067798 filed on Sep. 30, 2021.

* cited by examiner

[Fig 1]
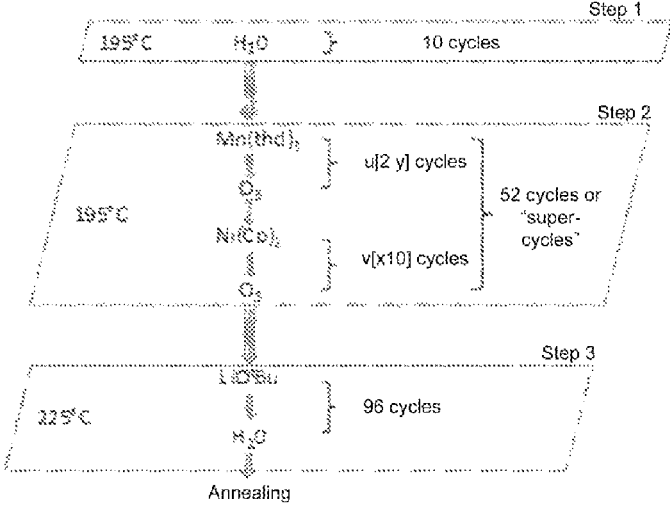
[Fig 2]
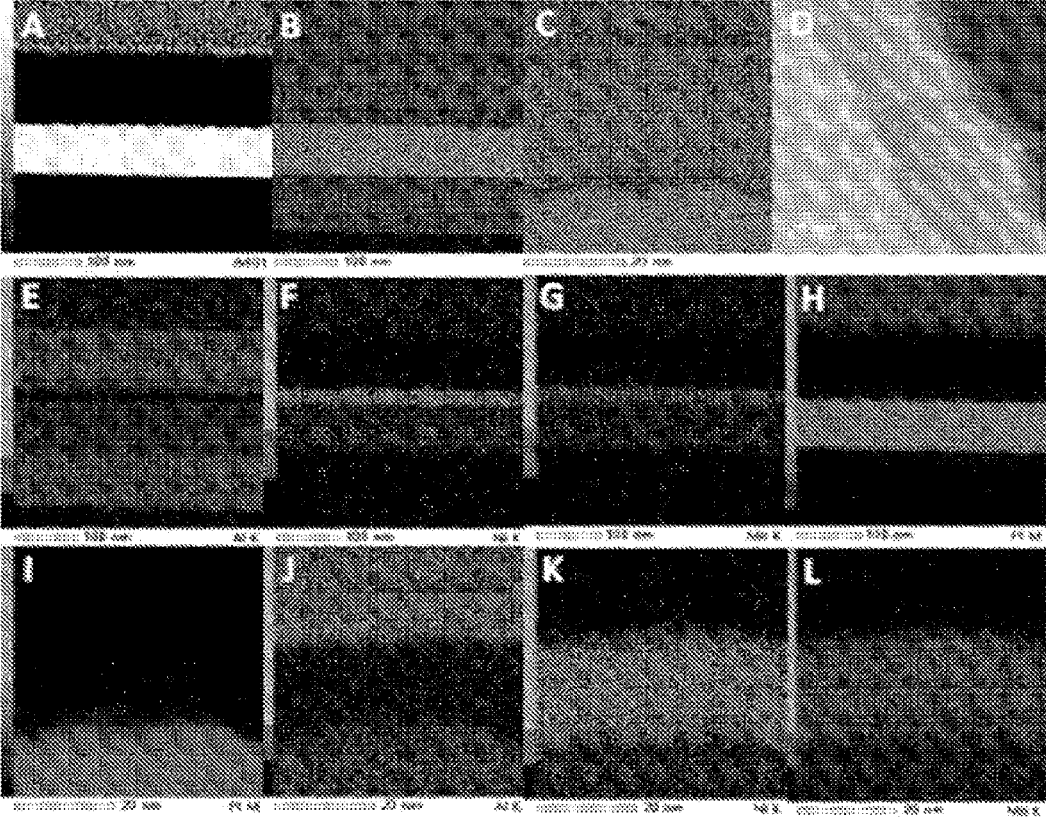

[Fig 3]
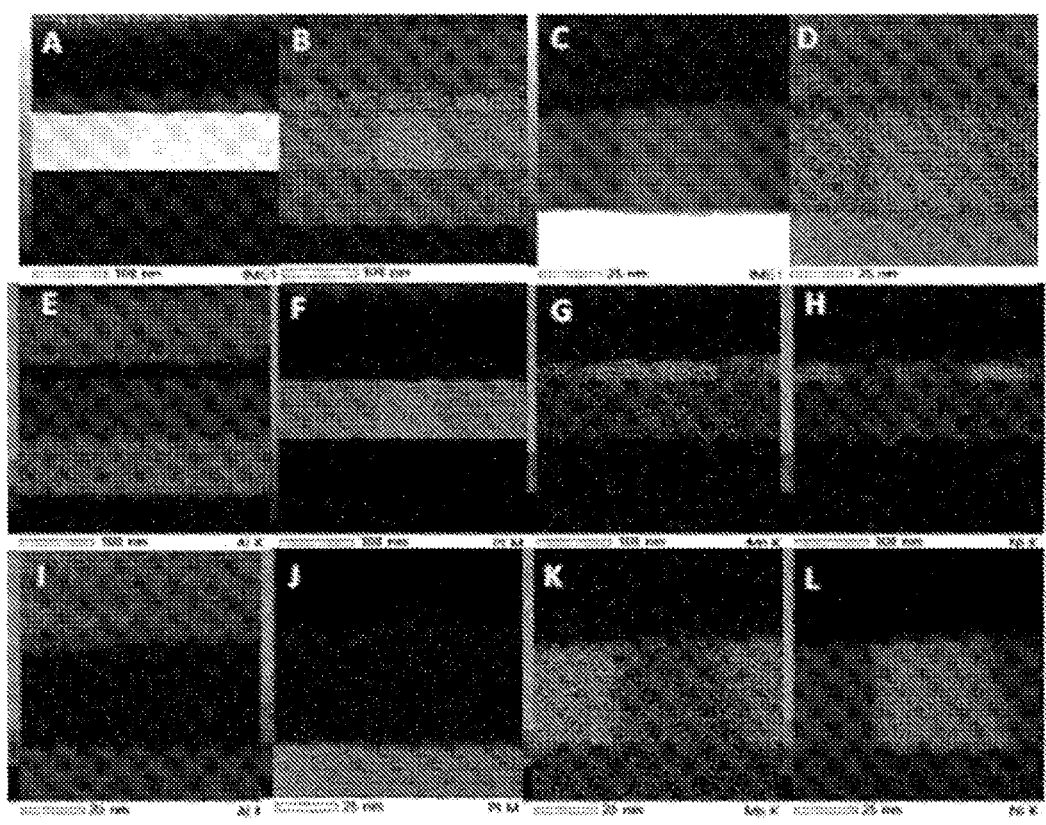

METHOD FOR MANUFACTURING A THIN-FILM LITHIATED MATERIAL

CROSS-REFERENCE TO RELATED APPLICATIONS

The present application is a filing under 35 U.S.C. 371 as the National Stage of International Application No. PCT/FR2021/051697, filed Sep. 30, 2021, entitled "METHOD FOR MANUFACTURING A THIN-FILM LITHIATED MATERIAL", which claims priority to French Application No. 2010047, filed with the Intellectual Property Office of France on Oct. 1, 2020, both of which are incorporated herein by reference in their entirety for all purposes.

The present invention relates to a method for manufacturing a lithiated material. More particularly, the invention relates to a method for manufacturing a material containing lithium deposited in thin layers on the surface of a substrate.

In the current prior art, methods are known for forming thin layers of materials on substrates of various types, in particular methods for producing layers of lithiated materials, i.e. materials containing lithium. These lithiated materials are in particular used in batteries, for example to form electrolytic barriers or electrodes, or in any other electrical storage device. These layers can be deposited by using an atomic layer deposition technique (commonly referred to by the acronym ALD) from precursors, by using an atomic layer chemical vapor deposition technique (commonly referred to by the acronym ALCVD), or else by using an atomic layer epitaxy technique (commonly referred to by the acronym ALE). In particular, the ALD technique is a thin-film deposition technique based on gas-surface reactions in order to expose the surface on which it is desired to deposit a layer of a material with different successive chemical precursors.

However, in the current prior art, there is no method for manufacturing a lithiated material containing thin layers, i.e. layers that have thicknesses of between 1 nm and 1 μm, are made up of electrochemically active complex materials and are, inter alia, homogeneous and suitable for conforming to the raised patterns of greater or lesser complexity of the surface of the substrate on which the lithiated material is deposited.

For the purposes of the present invention, the term "complex raised pattern" is understood to mean a substrate that has cavities, tubes or pillars machined into this substrate to form a three-dimensional skeleton producing a surface-to-volume ratio greater than 10.

Furthermore, in the prior art, there is no manufacturing method for manufacturing a positive electrode layer based on lithiated material suitable for three-dimensional batteries, or 3D batteries.

For the purposes of the present invention, the term "three-dimensional battery, or 3D battery" is understood to mean a battery that has a pattern defined by a thickness greater than 5 μm. For example, as a three-dimensional battery, or 3D battery, it is possible to have a microbattery composed of at least six layers of materials conformally deposited on a substrate that has been structured beforehand so as to form a three-dimensional mat producing a predefined specific surface area. These six layers are the following: an insulating layer, two current collector layers, a negative electrode layer, and a positive electrode layer. These two electrode layers are separated by a solid electrolyte. These six layers may optionally be protected by an additional encapsulation layer which would prevent aging of the 3D battery.

The object of the present invention is in particular to overcome all or some of the aforementioned drawbacks.

To this end, according to a first aspect, the invention relates to a method for manufacturing a lithiated material on a substrate, said lithiated material comprising multiple thin layers and said method comprising the following steps:

a) placing a substrate made of a material intended to be used in a battery in a reaction chamber, c1) at least one atomic layer deposition of a precursor of a first metal, selected from among nickel, manganese, cobalt, chromium, lanthanum, niobium, vanadium, iron, titanium and aluminum, through said reaction chamber, on at least part of a surface of said substrate, c2) at least one purge of said reaction chamber, c3) at least one diffusion of a first oxidizing species through said reaction chamber to obtain a thin layer of an oxide of the first metal, c4) at least one purge of said reaction chamber f1) at least one atomic layer deposition of a lithium precursor through said reaction chamber on top of said thin layer of an oxide of the first metal to form a lithiated thin layer, f2) at least one purge of said reaction chamber, said method being characterized in that it further comprises, after step f2), a crystallization annealing step g) at a temperature of between 600° C. and 800° C. for a period of between 1 and 4 hours to obtain a lithiated material.

For the purposes of the present invention, what is meant by a "material intended to be used in a battery" is any type of material that has sufficient mechanical strength not to be mechanically altered by the heat treatments usually implemented in battery manufacturing processes, is chemically inert and is electrochemically stable with temperature.

According to this first aspect of the invention, it is therefore possible to manufacture an electrochemically active material that comprises at least one thin layer of an oxide of a first metal as indicated above and a lithiated thin layer on a substrate. It is thus possible to deposit, on a substrate, electrochemically active complex materials that are capable of providing electrochemical performance suitable for three-dimensional batteries. For example, it is possible, via this manufacturing method, to manufacture a lithiated material containing thin layers that are, inter alia, homogeneous over an area greater than 7.5 cm a side.

It should be noted that this lithiated material may be used, for example, in electrochemical storage devices. In particular, such a lithiated material may be used to manufacture two-dimensional or three-dimensional batteries, in particular three-dimensional microbatteries, for example Li-ion microbatteries, for various applications. In two-dimensional or three-dimensional batteries, the substrate may then take the form of a two-dimensional or three-dimensional object.

For the purposes of the present invention, the term "two-dimensional object" is understood to mean a flat object, for example made of silicon, or any object able to act as a mechanical base for receiving layers of materials to manufacture a two-dimensional battery.

For the purposes of the present invention, the term "three-dimensional object" is understood to mean an object covered by a stack of materials, for example materials deposited in the form of thin layers by ALD. For example, the three-dimensional object may have, on at least one of its surfaces, structuring that may be produced by using microelectronics etching techniques or techniques for the growth of micro-/nano-objects.

Thus, with such a method according to the invention, when the substrate is microstructured, i.e. when the substrate exhibits a certain degree of surface roughness on at least one of its surfaces, the deposited lithiated material conforms to this microstructure such that it is therefore possible to easily form a lithiated material that perfectly follows the microstructure of the substrate so as to obtain a homogeneous material that has the same thickness over the entire area on which the material is formed.

In particular, a microstructured substrate has a greater specific surface area than a flat (i.e. non-microstructured) substrate. The surface area of a substrate may, for example, be increased by arranging microstructures that have a high aspect ratio on the surface of said substrate. The aspect ratio of a microstructure corresponds, for example, to the ratio of its longitudinal dimension to its smallest transverse dimension (for example the smallest transverse distance between two microstructures arranged consecutively on the substrate).

For example, as a microstructured substrate, it is possible to have substrates that comprise microstructures such as trenches, pillars and channels, or microstructures such as those taught in publication WO2015052412. It should also be noted that the substrate may be machinable using microfabrication techniques and must be able to withstand the heat treatments applied during the implementation of the method for the manufacture thereof, for example during the deposition and annealing steps.

For example, as a substrate, it is possible to have a substrate selected from among substrates made of silicon, $SiO_2$, of $Al_2O_3$, of Ti, of glass, and of Kapton®. Furthermore, the substrate may be flexible or rigid.

It should be noted that the precursor of the first metal may be in liquid or powder form. For example, the precursor of the first metal may be selected from among the following precursors: $FeCl_2$, $FeCp_2$, $Fe(thd)_3$, $La(thd)_3$, $CoCp_2$, $MnCp_2$, $Mn(thd)_3$, $NiCp_2$, $TiCl_4$, $NbOEt_5$, $Cr(OCl)_2$, without however being limited thereto.

It should be noted that step c3) of diffusing a first oxidizing species allows the breakage of the chemical bonds of the elements located on the surface after the implementation of step c1). This first oxidizing species is chosen according to the strength of the chemical bonds of the elements in question. For example, ozone is preferably used to promote the oxidation of manganese and thus bring about the formation of $MnO_2$.

Preferably, the thin layer of an oxide of the first metal has a thickness of between 5 and 15 nm. This first layer may also preferably be deposited at a rate of between 0.5 and 1 A per ALD cycle.

It should also be noted that the lithium precursor may be in powder form. For example, the lithium precursor may be LiOtBu, without however being limited thereto.

Preferably, the lithiated thin layer has a thickness of between 5 and 1000 nm. This first layer may also preferably be deposited at a rate of between 0.5 and 1 A per ALD cycle.

In one particular embodiment, it is advantageous to functionalize the substrate in order to facilitate subsequent deposition steps, in particular to promote the bonding to the substrate of the first atomic monolayers of the precursor of the first metal. Such functionalization also makes it possible to obtain a substrate whose surfaces do not comprise, or comprise very few, contaminating elements with a view to obtaining a surface state conducive to the desired chemical reactions during subsequent deposition steps. Therefore, in this embodiment, the method further comprises, between steps a) and c1), at least one step b1) of functionalizing the substrate, said functionalizing step b1) consisting in diffusing water through said reaction chamber and being followed by a step b2) of purging said reaction chamber of water.

Preferably, functionalizing step b1) is implemented at a temperature of between 180° C. and 220° C.

Preferably, the method further comprises a step b3) of a first iteration of the steps b1) and b2) $n_1$ times, said step b3) being carried out between step b2) and c1). This step makes it possible to greatly limit, or even eliminate completely, any contaminants that might be present on the surfaces of the substrate before subsequent deposition steps are carried out.

In one particular embodiment, it is advantageous to manufacture a lithiated material comprising at least one thin layer of an oxide of a first metal and a thin layer of an oxide of a second metal rather than just a single thin layer of an oxide of a first metal. Specifically, the presence, in the lithiated material, of at least two thin layers of an oxide of two different (transition) metals makes it possible to obtain a lithiated material that is electrochemically active at a higher potential compared with those currently used. In particular, it is thus possible to use such a lithiated material to manufacture a positive electrode for a three-dimensional battery that operates at high potential, i.e. operates at a potential higher than 4 V vs $Li/Li^+$. Therefore, in this embodiment, the method further comprises, between steps c2) and f1):

at least one step d1) of atomic layer deposition of a precursor of the second metal, selected from among nickel, manganese, cobalt, chromium, lanthanum, titanium and aluminum, or a phosphate precursor, through said reaction chamber on at least part of said thin layer of an oxide of the first metal, at least one step d2) of purging said reaction chamber, at least one step d3) of diffusing a second oxidizing species through said reaction chamber to obtain a thin layer of an oxide of the second metal or of phosphate, and at least one step d4) of purging said reaction chamber.

Like in step c3) of diffusing a first oxidizing species, step d3) of diffusing a second oxidizing species allows the breakage of the chemical bonds of the elements located on the surface after the implementation of step d1). This second oxidizing species is chosen according to the strength of the chemical bonds of the elements in question.

It should be noted that the first oxidizing species may be the same as the second oxidizing species, but this is not necessarily so.

For example, as first and/or second oxidizing species, ozone, water, or any other gaseous compound comprising oxygen, such as $CO_2$, may therefore be cited. Combinations of oxygen precursors may also be used either in separate steps of diffusing oxidizing species or simultaneously in the same step of diffusing a first or second oxidizing species.

It is also possible to implement further steps similar to the aforementioned steps d1) to d4) so as to obtain thin layers of an oxide of additional metals. For example, in this way it is therefore possible to obtain the following materials: $Li_xM1_yM2_zM3_sO_t$ where M1, M2 and M3 are transition metals from among Ni, Mn, Co, Cr, and Al, such as $LiNi_{1/3}Mn_{1/3}Co_{1/3}O_2$, $Li_xNi_yCo_zAl_rO_2$ (where y+z+t=1).

Preferably, the thin layer of an oxide of the second metal or of phosphate may have a thickness of between 5 and 15 nm. This layer may also preferably be deposited at a rate of between 0.5 and 1 A per ALD cycle.

It should be noted that the precursor of the second metal or phosphate precursor is either the same as that deposited in step c1) or different. Thus, by forming thin layers derived from different transition metal precursors, it is possible to form ternary, quaternary or quinary lithiated materials, for example.

It should be noted that the precursor of the second metal or phosphate precursor may be in liquid or powder form. For example, the precursor of the second metal or phosphate precursor may be selected from among the following precursors: $La(thd)_3$, $CoCp_2$, $MnCp_2$, $Mn(thd)_3$, $NiCp_2$, $TiCl_4$, $Cr(OCl)_2$, without however being limited thereto.

Preferably, the method further comprises a step c5) of a second iteration of steps c1) to c4) n2 times. It should be noted that this step c5) is preferably carried out between steps c4) and d1). Thus, it is possible both to obtain homogeneous growth of the oxide of the first metal described by these steps c1) to c4) and to control the final stoichiometry of the desired lithiated material to be manufactured.

Preferably, the method further comprises a step d5) of a third iteration of steps d1) to d4) ns times, said step d5) being carried out between steps d4) and f1). Thus, it is possible both to obtain homogeneous growth of the oxide of the second metal described by these steps d1) to d4) and to control the final stoichiometry of the desired lithiated material to be manufactured.

Preferably, the method further comprises a step e) of a fourth iteration of steps c1) to d4) n4 times. It should be noted that this step e) is preferably carried out between steps d5) and f1). Thus, it is possible to increase the thicknesses of each of the thin layers of an oxide of the first and second metals, and therefore of active materials, in order to improve the performance of a three-dimensional battery comprising such a lithiated material.

In one particular embodiment, it is advantageous to greatly limit, or even eliminate, carbon species which would have been formed following the implementation of step f1) of atomic layer deposition of the lithium precursor. Therefore, in this embodiment, the method further comprises, between steps f2) and g), at least one step f3) of forced oxidation of said lithiated thin layer, said forced oxidation step f3) consisting of the diffusion of water into said reaction chamber and being followed by a step f4) of purging said reaction chamber.

Preferably, forced oxidation step f3) is implemented at a temperature of between 180° C. and 220° C.

In steps b1) and f3), the water is preferably deionized.

Preferably, the method further comprises a step f5) of a fifth iteration of steps f1) to f4) $n_5$ times, said step f5) being carried out between steps f4) and g). Thus, it is possible to increase the thickness of the atomic layer of the lithium precursor.

Preferably, $n_5$ is defined as follows $n_5 = 0.05*(n_2+n_3)*n_4$. For example, in this way, the ratio of the manganese and nickel ALD cycles may be optimized so as to allow the formation of the lithiated material while limiting the presence of lithium oxide (NiO) and $Li_2MnO_3$.

Thus, by adjusting the values of $n_1$ to $n_5$, it is possible to obtain different stoichiometries of materials comprising lithium, nickel, manganese and oxygen (hereinafter referred to as LNMO material).

Furthermore, it should be noted that the purge steps consist in drawing an inert gas through the reaction chamber after each precursor pulse in particular, or even at the same time as the precursor pulse. As a variant, multiple purge pulses may be performed between each precursor pulse. The purge steps are intended to remove all unreacted reagents, thereby ensuring that the production of the lithiated material takes place according to self-limiting gas-surface reactions.

Thus, the reaction chamber may be purged by making a purge gas flow through the chamber or, alternatively, by flushing the chamber by reducing the pressure. Suitable purge gases comprise inert gases such as nitrogen, argon, etc., although any suitable gas or gas mixture that does not react with the deposited thin layer of material containing the precursors may be pulsed.

According to a second aspect, the invention relates to the lithiated material that can be obtained by means of a method as defined above.

The invention will be better understood from reading the following description, which is provided solely by way of example, and with reference to the appended figures, in which:

FIG. 1 schematically shows one exemplary implementation of a manufacturing method according to the invention;

FIG. 2 shows a TEM image of a cross-sectional view of the material from example 1 before annealing obtained according to one embodiment of the invention, a protective layer of alumina $(Al)_2O_3$ being further deposited on this material; and FIG. 3 shows a TEM image of a cross-sectional view of the material from example 1 after annealing obtained according to one embodiment of the invention, a protective layer of alumina $(Al)_2O_3$ being further deposited on this material.

DEVICES/PRODUCTS

Devices:
    the reaction chamber: PICOSUN R200 ALD reactor.
Products:
    Substrate: BT Electronics, Siltronix (Si (100), 5 to 10 ohm·cm, 2" to 4", 1 polished face)
    ALD precursors:
    for platinum: Trimethyl) methylcyclopentadienylplatinum (IV), 99%, Merck, Strem Chemicals
    for phosphate: Trimethylphosphate, min. 97%, Merck, Strem Chemicals
    for lithium: Lithium t-butoxide, 98+%, Merck, Strem Chemicals
    for alumina: Trimethylaluminum, min. 98%, Merck, Strem Chemicals
    for nickel: Bis(cyclopentadienyl)nickel, 99% (Nickelocene), Merck, Strem Chemicals
    for manganese: Tris(2,2,6,6-tetramethyl-3,5-heptanedionato)manganese (III), 99% Mn(TMHD)3), Merck, Strem Chemicals.

EXAMPLES

Example 1: Producing a First Lithiated Material According to the Invention

The lithiated material produced in this example is $LiNi_{0.5}Mn_{1.5}O_4$ (LNMO) applied to a two-dimensional substrate and is obtained as indicated below using the atomic layer deposition (ALD) technique.

The method followed in this example comprises four main steps:
    forming a thin film of $MnO_2$;
    forming a thin film of NiO;
    forming a lithiated thin film on the surface;
    crystallization annealing allowing the formation of the LNMO material.

More particularly, the successive steps implemented in this example are the following (illustrated in FIG. 1):

a) placing a two-dimensional silicon substrate in a reaction chamber; b1) functionalizing the substrate which consists in diffusing deionized water through said high reaction chamber at a temperature of 195° C.;

b2) purging said reaction chamber;

b3) first iteration of steps b1) and b2) 10 times;

c1) atomic layer deposition of a manganese (Mn) precursor by drawing Mn(thd)3 through the high reaction chamber at a temperature of 195° C. to form a thin layer comprising Mn on the surface of the substrate;

c2) purging the reaction chamber;

c3) ozone diffusion by drawing ozone through the high reaction chamber at a temperature of 195° C. to promote the reaction of ozone with the thin layer comprising Mn previously formed on the surface of the substrate at the end of step c1), thereby forming a thin layer of $MnO_2$;

c4) purging the reaction chamber;

c5) second iteration of steps c1) to c4) 27 times;

d1) atomic layer deposition of a nickel (Ni) precursor by drawing $Ni(Cp)_2$ through the high reaction chamber at a temperature of 195° C. to form a thin layer comprising Ni on the surface of the thin layer of $MnO_2$;

d2) purging the reaction chamber;

d3) ozone diffusion by drawing ozone through the high reaction chamber at a temperature of 195° C. to promote the reaction of ozone with the thin layer comprising Ni previously formed on the surface of the thin layer of $MnO_2$ formed at the end of step d1), thereby forming a thin layer of NiO;

d4) purging the reaction chamber;

d5) third iteration of steps d1) to d4) 10 times;

e) fourth iteration of steps c1) to d4) 52 times; obtaining a layer of $MnO_2$—NiO;

f1) atomic layer deposition of a Li precursor by drawing LiOtBu through the high reaction chamber at a temperature of about 225° C. to form a thin layer comprising Li on the surface of the layer of $MnO_2$—NiO;

f2) purging the reaction chamber;

f3) oxidizing the lithiated thin layer by diffusing deionized water through the high reaction chamber at a temperature of about 225° C. to promote the reaction of the water with the layer comprising Li previously formed on the surface of the layer of $MnO_2$—NiO formed at the end of step f1), thereby forming a thin layer of lithium oxide;

f4) purging the reaction chamber;

f5) fifth iteration of steps f1) to f4) 96 times;

g) crystallization annealing at a temperature of about 700° C. for 2 hours in air.

By proceeding in this way, a lithiated material $LiNi_{0.5}Mn_{1.5}O_4$ deposited on a silicon substrate and having a thickness of 100 nm is obtained.

It should be noted that the above-mentioned steps may also be applied to a microstructured substrate such as that described in document WO2015052412.

Tests

Analyses by means of transmission electron microscopy (commonly referred to by the acronym TEM) (see FIGS. 2 and 3) of the lithiated material obtained according to example 1 before (see FIG. 2) and after (see FIG. 3) the annealing implemented in step g) were carried out. The lithiated material is deposited on a layer of platinum applied from a platinum precursor which is able to act as a battery collector layer. The assembly of the platinum layer and lithiated material was protected from cutting by focused ion beam (commonly referred to by the acronym FIB) by an 85 nm layer of alumina, $Al_2O_3$, deposited by ALD at 300° C. on the lithium oxide layer of the material before annealing, this alumina layer being applied from an alumina precursor.

The analysis of the material before annealing is given in FIG. 2. Cells A, B, C and D illustrate the aforementioned various stacked layers (A and B at a first scale, and C and D at a second scale as indicated in the figures). In cells A and B of FIG. 2, from the bottom to the top, a first layer of alumina, a first layer of platinum, a layer of manganese-nickel, a second layer of alumina, and a second layer of platinum can be seen. In cells C and D of FIG. 2, from the bottom to the top, the first layer of platinum, the layer of manganese-nickel, and the second layer of alumina can be seen.

Furthermore, it should be noted that there is no space between the various layers mentioned above before annealing. This absence of a space is characteristic of sufficient adhesion between the layers. In addition, in cells E to L, no interdiffusion of the alumina or of the platinum with the lithiated material (here the manganese-nickel layer because the lithium layer is not visible in the photographs, as lithium is not visible in transmission electron microscopy) is observed. The layer of platinum to which the lithiated material is applied, in the case of a battery where this layer may be a collector layer, exhibits surface roughness and the orientation of its grains affects the orientation of the lithiated material deposited on top, the lithiated material thus acting as the positive electrode layer. It can also be seen that the manganese and nickel are intimately mixed, forming a homogeneous layer and indicating a good distribution of the elements during the deposition by ALD. Thus, the thin layer of Ni, formed after the deposition of the thin layer of Mn and on top thereof, has diffused into the layer of Mn, forming the manganese-nickel layer.

The analysis of the material after annealing is given in FIG. 3. In this FIG. 3, in cells A and B, from the bottom to the top, a first layer of alumina, a layer of platinum, a layer of manganese-nickel, and a second layer of alumina can be seen. In cells C and D of FIG. 2, from the bottom to the top, the layer of platinum, the layer of manganese-nickel, and the second layer of alumina can be seen. In addition, it is possible here to further discern the affect of the orientation of the grains of the collector layer, the platinum layer, on the preferred orientation of the grains of the LNMO material. Generally, demixing is observed between the manganese and nickel. Specifically, it is observed that zones depleted in nickel are enriched in manganese and vice versa, but in different proportions. It should also be noted that NiO is observed after the annealing and the formation of the LNMO material.

Each of the cells of FIGS. 2 and 3 corresponds to a chemical map of the layers stacked on the silicon substrate. The chemical elements are given in the legend for each cell E to L. A color (or a grayscale level) is assigned to each chemical element. The analysis technique used also makes it possible to overlay the colors, or grayscale levels, of the various elements (see cells B and C of FIG. 2 and cells B and D of FIG. 3).

In each of these two FIGS. 2 and 3), there are two different scales (one scale for cells A and B and another scale for cells C and D). The TEM analysis and then the chemical map with all of the elements overlaid are shown in the cell images. In cells E to L of FIG. 2 and E to L of FIG. 3, each chemical element (Al, Pt, Ni, Mn) is shown alone. This allows more precise access to information such as the interdiffusion, or absence thereof, of elements between successive layers or the distribution of these various elements. In cells G and H, and K and L of FIG. 3, a demixing of the manganese-nickel elements is observed for the manganese-nickel ratios taken into account in FIG. 1. There is also no interdiffusion visible between the layers of platinum and alumina or between the layers of platinum and manganese-nickel in cells F to H or I, K and L of FIG. 3.

The invention claimed is:

1. A method for manufacturing a lithiated material on a substrate, said lithiated material comprising multiple thin layers and said method comprising the following steps:

a) placing a substrate made of a material intended to be used in a battery in a reaction chamber, c1) at least one atomic layer deposition of a precursor of a first metal, selected from among nickel, manganese, cobalt, chromium, lanthanum, niobium, vanadium, iron, titanium, and aluminum, through said reaction chamber, on at least part of a surface of said substrate, c2) at least one purge of said reaction chamber, c3) at least one diffusion of a first oxidizing species through said reaction chamber to obtain a thin layer of an oxide of the first metal, c4) at least one purge of said reaction chamber, f1) at least one atomic layer deposition of a lithium precursor through said reaction chamber on top of said thin layer of an oxide of a first metal to form a lithiated thin layer, f2) at least one purge of said reaction chamber, said method being characterized in that it further comprises, after step f2), a crystallization annealing step g) at a temperature of between 600° C. and 800° C. for a period of between 1 and 4 hours to obtain a lithiated material, wherein said lithiated material is a positive electrode and wherein step f2) is performed after forming the lithiated thin layer in step f1), and wherein the crystallization annealing step g) is performed after step f2) with the lithiated thin layer as a surface layer.

2. The method as claimed in claim 1, further comprising, between steps a) and c1), at least one step b1) of functionalizing the substrate, said functionalizing step b1) consisting in diffusing water through said reaction chamber and being followed by a step b2) of purging said reaction chamber of water.

3. The method as claimed in claim 2, further comprising a step b3) of a first iteration of the steps b1) and b2) $n_1$ times, said step b3) being carried out between step b2) and c1).

4. The method as claimed in claim 1, further comprising a step c5) of a second iteration of steps c1) to c4) $n_2$ times.

5. The method as claimed in claim 1, further comprising, between steps c2) and f1):

at least one step d1) of atomic layer deposition of a precursor of the second metal, selected from among nickel, manganese, cobalt, chromium, lanthanum, titanium and aluminum, or a phosphate precursor, through said reaction chamber on at least part of said layer of an oxide of the first metal, at least one step d2) of purging said reaction chamber, at least one step d3) of diffusing a second oxidizing species through said reaction chamber to obtain a thin layer of an oxide of the second metal or of phosphate, and at least one step d4) of purging said reaction chamber.

6. The method as claimed in claim 5, further comprising a step d5) of a third iteration of steps d1) to d4) $n_3$ times, said step d5) being carried out between steps d4) and f1).

7. The method as claimed in claim 5, further comprising a step e) of a fourth iteration of steps c1) to d4) $n_4$ times.

8. The method as claimed in claim 1, further comprising, between steps f2) and g), at least one step f3) of forced oxidation of said lithiated thin layer, said forced oxidation step f3) consisting of the diffusion of water into said reaction chamber and being followed by a step f4) of purging said reaction chamber.

9. The method as claimed in claim 8, further comprising a step f5) of a fifth iteration of steps f1) to f4) $n_5$ times, said step f5) being carried out between steps f4) and g).

10. The method as claimed in claim 1, wherein said substrate is a microstructured substrate.

\* \* \* \* \*